(12) United States Patent
Mihara

(10) Patent No.: US 8,293,574 B2
(45) Date of Patent: Oct. 23, 2012

(54) SEMICONDUCTOR DEVICE HAVING A PLURALITY OF SEMICONDUCTOR CONSTRUCTS

(75) Inventor: Ichiro Mihara, Tachikawa (JP)

(73) Assignee: Teramikros, Inc., Tokyo (JP)

( * ) Notice: Subject to any disclaimer, the term of this patent is extended or adjusted under 35 U.S.C. 154(b) by 128 days.

(21) Appl. No.: 12/719,411

(22) Filed: Mar. 8, 2010

(65) Prior Publication Data
US 2010/0178731 A1    Jul. 15, 2010

Related U.S. Application Data

(63) Continuation of application No. 11/650,808, filed on Jan. 8, 2007, now abandoned.

(30) Foreign Application Priority Data

Jan. 10, 2006 (JP) .................... 2006-002017

(51) Int. Cl.
*H01L 21/00* (2006.01)
(52) U.S. Cl. .................... 438/107; 438/108; 438/109
(58) Field of Classification Search .................. 438/107, 438/108, 109
See application file for complete search history.

(56) References Cited

U.S. PATENT DOCUMENTS

| | | | |
|---|---|---|---|
| 6,765,299 B2 | 7/2004 | Takahashi et al. | |
| 7,064,440 B2 | 6/2006 | Jobetto et al. | |
| 7,256,496 B2 | 8/2007 | Okada et al. | |
| 7,279,750 B2 | 10/2007 | Jobetto | |
| 7,608,480 B2 | 10/2009 | Jobetto | |
| 2003/0025184 A1 | 2/2003 | Morozumi | |
| 2004/0070064 A1 | 4/2004 | Yamane et al. | |
| 2005/0218451 A1* | 10/2005 | Jobetto | ......................... 257/347 |

FOREIGN PATENT DOCUMENTS

| | | |
|---|---|---|
| JP | 2000-252314 A | 9/2000 |
| JP | 2001-257310 A | 9/2001 |
| JP | 2001-298149 A | 10/2001 |
| JP | 2003-31768 A | 1/2003 |
| JP | 2003-51569 A | 2/2003 |
| JP | 2004-71998 A | 3/2004 |
| JP | 2005-158768 A | 6/2005 |

(Continued)

OTHER PUBLICATIONS

Japanese Office Action dated May 31, 2011 (and English translation thereof) in counterpart Japanese Application No. 2010-1533.
Japanese Office Action dated Mar. 3, 2009 (3 pages), and English translation thereof (3 pages) issued in counterpart Japanese Application No. 2006-002017.

*Primary Examiner* — Phat X Cao
(74) *Attorney, Agent, or Firm* — Holtz, Holtz, Goodman & Chick, PC

(57) ABSTRACT

A semiconductor device includes a plurality of semiconductor constructs, each of the semiconductor constructs including a semiconductor substrate and external connection electrodes provided on an upper surface of the semiconductor substrate. The semiconductor substrates of the semiconductor constructs are different in a planar-size. The plurality of semiconductor constructs are stacked from bottom to top in descending order of planar-sizes of the semiconductor substrates included in the plurality of semiconductor constructs. An insulating film at least is provided around one semiconductor construct disposed on the top of the plurality of semiconductor constructs and on another semiconductor construct disposed under the one semiconductor construct. Each of the upper surfaces of the plurality of external connection electrodes is exposed from the one semiconductor construct and from the insulating film.

28 Claims, 18 Drawing Sheets

FOREIGN PATENT DOCUMENTS

| | | |
|---|---|---|
| JP | 2005-216935 A | 8/2005 |
| JP | 2005-294547 A | 10/2005 |
| JP | 2005-311007 A | 11/2005 |
| JP | 2005-347461 A | 12/2005 |

* cited by examiner

SEMICONDUCTOR DEVICE HAVING A PLURALITY OF SEMICONDUCTOR CONSTRUCTS

CROSS-REFERENCE TO RELATED APPLICATIONS

The present application is a Continuation Application of U.S. application Ser. No. 11/650,808 filed Jan. 8, 2007 now abandoned, which is based upon and claims the benefit of priority from prior Japanese Patent Application No. 2006-002017, filed Jan. 10, 2006, the entire contents of both of which are incorporated herein by reference.

BACKGROUND OF THE INVENTION

1. Field of the Invention

This invention relates to a semiconductor device in which a plurality of semiconductor constructs are stacked.

2. Description of the Related Art

In a conventional semiconductor device, a first semiconductor construct is stacked on a base board, and a second semiconductor construct having a planar-size smaller than that of the first semiconductor construct is stacked on a part of the first semiconductor construct. A plurality of external connection electrodes are provided in a peripheral area of the upper surface of the first semiconductor construct which is exposed without being covered by the second semiconductor construct, and a plurality of external connection electrodes are provided on the upper surface of the second semiconductor construct. These external connection electrodes are connected by bonding wires to respective upper layer connection pads provided on the base board around the first semiconductor construct. The first and second semiconductor constructs including the bonding wires are covered with a sealing material, and a plurality of lower layer connection pads are provided under the base board so that each of the lower layer connection pads is connected to the upper layer connection pad via a vertical conductor vertically extended in the base board. A plurality of solder balls are provided under the lower layer connection pads. A semiconductor device having such a configuration is disclosed in, for example, Jpn. Pat. Appln. KOKAI Publication No. 2005-158768.

The conventional semiconductor device described above has the following problems due to the connection by the bonding wires. That is, the diameter of the bonding wire is generally small because costs increase if the diameter of the bonding wire made of gold is relatively large, and the impedance of the bonding wire is high because the bonding wire is relatively long, which makes it impossible for the bonding wire to adapt to use at a high frequency. Further, the bonding wire hardly has heat releasing properties, and the heat releasing properties of the first and second semiconductor constructs therefore become worse. Moreover, since the base board (interposer) having the vertical conductors is used, costs increase.

BRIEF SUMMARY OF THE INVENTION

This invention is directed to provide a semiconductor device capable of reducing at least costs among the problems described above.

A semiconductor device according to a first aspect of this invention, there is provided a semiconductor device comprising:

(i) a plurality of semiconductor constructs, each of the semiconductor constructs including a semiconductor substrate and a plurality of external connection electrodes provided on an upper surface of the semiconductor substrate, the semiconductor substrates of the semiconductor constructs being different in a planar-size, the plurality of semiconductor constructs being stacked from bottom to top in descending order of planar-sizes of the semiconductor substrates included in the plurality of semiconductor constructs;

(ii) an insulating film at least provided around one semiconductor construct disposed on the top of the plurality of semiconductor constructs, and on another semiconductor construct disposed under the one semiconductor construct, each of the upper surfaces of the plurality of external connection electrodes being exposed from the one semiconductor construct and from the insulating film.

Furthermore, a semiconductor device according to a second aspect of this invention, there is provided a semiconductor device comprising:

(i) a plurality of semiconductor constructs, each of the semiconductor constructs including a semiconductor substrate and a plurality of external connection electrodes provided on an upper surface of the semiconductor substrate, the semiconductor substrates of the semiconductor constructs being different in a planar-size, said plurality of semiconductor constructs being stacked from bottom to top in descending order of planar-sizes of the semiconductor substrates included in the plurality of semiconductor constructs;

(ii) an insulating film at least provided around one semiconductor construct disposed on the top of the plurality of semiconductor constructs, and on another semiconductor construct disposed under the one semiconductor construct; and (iii) a plurality of upper layer wiring lines electrically connected to the plurality of external connection electrodes, respectively, all of the plurality of upper layer wiring lines being formed on the one semiconductor construct and on the insulating film.

Still further, a semiconductor device according to a third aspect of this invention, there is provided a semiconductor device comprising:

(i) a first semiconductor construct having a first semiconductor substrate, and a plurality of first external connection electrodes provided on the first semiconductor substrate;

(ii) a second semiconductor construct having a second semiconductor substrate, a plurality of second external connection electrodes provided on the second semiconductor substrate, and a second sealing film;

the first semiconductor substrate being larger in a planar-size than the second semiconductor substrate, the second semiconductor construct being stacked on or over the first semiconductor construct, (iii) an insulating film provided around the second semiconductor construct and on the first semiconductor construct, each of the upper surfaces of the plurality of second external connection electrodes penetrating the second sealing film is exposed from the second sealing film, each of the upper surfaces of the plurality of first external connection electrodes penetrating the insulating film is exposed from the insulating film.

Further yet, a semiconductor device according to a fourth aspect of this invention, there is provided a semiconductor device comprising:

(i) a first semiconductor construct having a first semiconductor substrate, a plurality of first external connection electrodes provided on the first semiconductor substrate, and a first sealing film;

(ii) a second semiconductor construct having a second semiconductor substrate, a plurality of second external connection electrodes provided on the second semiconductor substrate, and a second sealing film;

the first semiconductor substrate being larger in a planar-size than the second semiconductor substrate, the second semiconductor construct being stacked on or over the first semiconductor construct, all of the plurality of first external connection electrodes being formed to penetrate the first sealing film, all of the plurality of second external connection electrodes being formed to penetrate the second sealing film, (iii) an insulating film provided around the second semiconductor construct and on the first semiconductor construct;

(iv) a plurality of first upper layer wiring lines electrically connected to the plurality of first external connection electrodes, respectively, and formed on the insulating film; and (v) a plurality of second upper layer wiring lines electrically connected to the plurality of second external connection electrodes, respectively, and formed on the second semiconductor construct.

According to this invention, since all the upper surfaces of the plurality of external connection electrodes are exposed on the one semiconductor construct and on the insulating film, the electrical connection wiring lines are mainly in a thickness direction of the semiconductor construct. Thus, the length of the wiring lines is reduced to make it possible to adapt to use at a high frequency. Further, heat can be released via the external connection electrodes of the semiconductor construct, so that the heat releasing properties can be improved. Moreover, costs can be reduced because a base board (interposer) having vertical conductors as heretofore used is not used.

DETAILED DESCRIPTION OF THE INVENTION

First Embodiment

Figure 1:
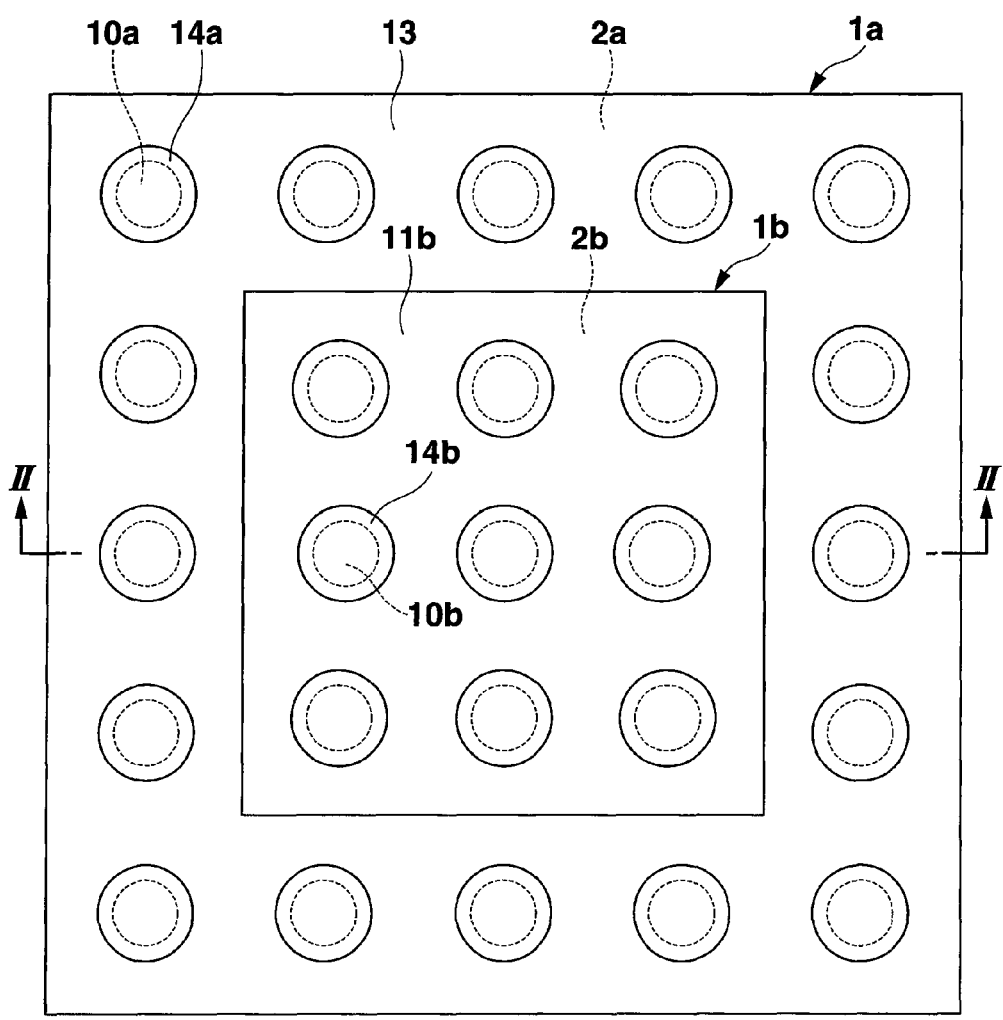
FIG. 1 is a plan view of a semiconductor device as a first embodiment of this invention.
Figure 2:
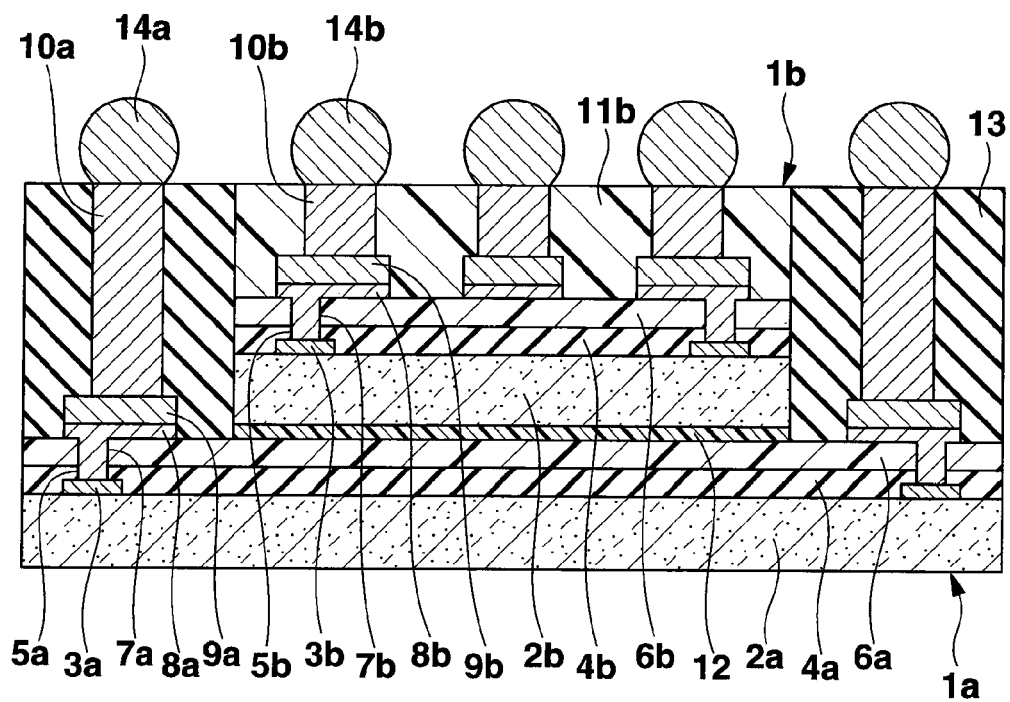
FIG. 2 is a sectional view along the line II-II of FIG. 1.

FIG. 1 is a plan view of a semiconductor device as a first embodiment of this invention, and FIG. 2 is a sectional view along the line II-II of FIG. 1. This semiconductor device includes a first planar square semiconductor construct $1a$, and a second planar square semiconductor construct $1b$ stacked on the first semiconductor construct $1a$. The first and second semiconductor constructs $1a$ and $1b$ are different in a planar-size but are much the substantially same in basic configuration, and are so-called chip size packages (CSPs) in general.

The first and second semiconductor constructs $1a$ and $1b$ respectively include planar square silicon substrates (semiconductor substrates) $2a$ and $2b$. The planar-size of the second silicon substrate $2b$ is somewhat smaller than the planar-size of the first silicon substrate $2a$. Integrated circuits (not shown) having a predetermined function are provided on the upper surfaces of the silicon substrates $2a$ and $2b$, and a plurality of first and second connection pads $3a$ and $3b$ made of a conductive material such as an aluminum-based metal are provided in the peripheral areas of the upper surfaces of the silicon substrates $2a$ and $2b$ so that the respective connection pads are electrically connected to the integrated circuits.

Insulating films $4a$ and $4b$ made of, for example, silicon oxide are respectively provided on the upper surfaces of the first and second connection pads $3a$ and $3b$ except for the centers of these first and second connection pads and on the upper surfaces of the silicon substrates $2a$ and $2b$. The centers of the first and second connection pads $3a$ and $3b$ are exposed via through holes $5a$ and $5b$ formed in the insulating films $4a$ and $4b$. Protective films $6a$ and $6b$ made of, for example, a polyimide-based resin are provided all over the upper surfaces of the insulating films $4a$ and $4b$. Through holes $7a$ and $7b$ are formed in parts of the protective films $6a$ and $6b$ corresponding to the through holes $5a$ and $5b$ of the insulating films $4a$ and $4b$.

Foundation metal layers $8a$ and $8b$ made of a conductive material such as copper are partly provided on the upper surfaces of the protective films $6a$ and $6b$. First and second wiring lines $9a$ and $9b$ made of a conductive material such as copper are provided all over the upper surfaces of the foundation metal layers $8a$ and $8b$. Respective one ends of the foundation metal layers $8a$, $8b$ extend to the first, second connection pads $3a$, $3b$ via the respective holes $5a$, $5b$ of the insulating films $4a$, $4b$ and the holes $7a$, $7b$ of the protective films $6a$, $6b$, such that the first and second wiring lines $9a$ and $9b$ are electrically connected to the first and second connection pads $3a$ and $3b$.

First and second columnar or bump electrodes (external connection electrodes) $10a$ and $10b$ made of a conductive material such as copper are provided on the upper surfaces of the first and second wiring lines $9a$ and $9b$. In the present specification, connection parts between the upper surfaces of the first and second wiring lines $9a$ and $9b$ and the first and second columnar or bump electrodes $10a$ and $10b$ are called electrical connection parts. The height of the first columnar electrode $10a$ is somewhat larger than the height of the second columnar electrode $10b$. As shown in FIG. 1, the first columnar electrodes $10a$ are arranged in one line (a plurality of lines are also possible) on four sides on the silicon substrate $2a$ along these sides, and the second columnar electrodes $10b$ are arranged in matrix form on the silicon substrate $2b$. Here, $3 \times 3 = 9$ second columnar electrodes $10b$ are only shown, but this is for convenience of the figure, and ten or more second columnar electrodes $10b$ are actually arranged in matrix form on all the sides. Here, the matrix form means the vertical and horizontal arrangements in a plurality of rows and columns, but also includes the arrangements in a plurality of rows and columns only in peripheral parts with nothing arranged in the center.

A second sealing film 11b made of, for example, an epoxy-based resin is provided on the upper surfaces of the second wiring line 9b and the protective film 6b so that the upper surface of this sealing film is flush with the upper surface of the second columnar electrode 10b. In this case, the upper surface of the second columnar electrode 10b and the upper surface of the second sealing film 11b are as high as the upper surface of the first columnar electrode 10a of the first semiconductor construct 1a.

Here, the first semiconductor construct 1a is constituted of the silicon substrate 2a, the first connection pad 3a, the insulating film 4a, the protective film 6a, the foundation metal layer 8a, the first wiring line 9a and the first columnar electrode 10a. The second semiconductor construct 1b is constituted of the silicon substrate 2b, the second connection pad 3b, the insulating film 4b, the protective film 6b, the foundation metal layer 8b, the second wiring line 9b, the second columnar electrode 10b and the second sealing film 11b. It will therefore be appreciated that the first semiconductor construct 1a does not include a film corresponding to the second sealing film 11b of the second semiconductor construct 1b.

The lower surface of the silicon substrate 2b of the second semiconductor construct 1b is adhesively bonded via an adhesive bonding layer 12 made of a die bond material to the center of the upper surface of the protective film 6a of the first semiconductor construct 1a, that is, an area except for an area where the first columnar electrodes 10a are disposed. An insulating film 13 made of an insulating resin such as an epoxy-based resin is provided on the upper surface of the protective film 6a of the first semiconductor construct 1a and the upper surface of the first wiring line 9a around the second semiconductor construct 1b so that the upper surface of this insulating film 13 is flush with the upper surface of the first columnar electrode 10a of the first semiconductor construct 1a and the upper surface of the second sealing film 11b of the second semiconductor construct 1b. Solder balls 14a and 14b are provided on and electrically connected to the upper surfaces of the first and second columnar electrodes 10a and 10b of the first and second semiconductor constructs 1a and 1b.

As described above, in this semiconductor device, the second semiconductor construct 1b having a planar-size somewhat smaller than that of the first semiconductor construct 1a is stacked and provided in the center of the upper surface of the first semiconductor construct 1a, and the insulating film 13 is provided on the first semiconductor construct 1a around the second semiconductor construct 1b, and then the solder balls 14a and 14b are respectively provided on the first and second columnar or bump electrodes 10a and 10b of the first and second semiconductor constructs 1a and 1b. Thus, the electrical connection wiring lines are mainly in a thickness direction of the first and second semiconductor constructs 1a and 1b, such that the length of the wiring lines is reduced to make it possible to adapt to use at a high frequency.

Furthermore, heat can be released to the outside via the first and second columnar electrodes 10a and 10b of the first and second semiconductor constructs 1a and 1b and via the solder balls 14a and 14b provided thereon, so that heat releasing properties can be improved. Moreover, costs can be reduced because a base board (interposer) having vertical conductors as heretofore used is not used.

Figure 3:
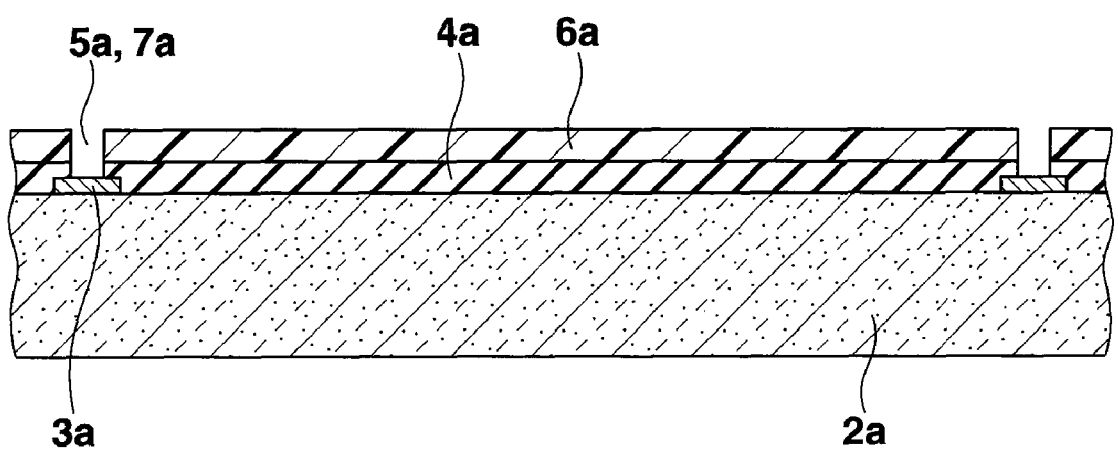
FIG. 3 is a sectional view of initially prepared components in one example of a method of manufacturing the semiconductor device shown in FIG. 2.

Next, one example of a method of manufacturing this semiconductor device will be described. First, as shown in FIG. 3, an assembly is prepared in which the first connection pad 3a made of, for example, an aluminum-based metal, the insulating film 4a made of, for example, silicon oxide, and the protective film 6a made of, for example, a polyimide-based resin are provided on the silicon substrate 2a in a wafer state, and the center of the first connection pad 3a is exposed via the hole 5a and 7a formed in the insulating film 4a and the protective film 6a.

In this case, integrated circuit of circuits (not shown) having a predetermined function are formed in areas of the upper surface of the silicon substrate 2a in the wafer state where the first semiconductor constructs 1a are formed, and the first connection pads 3a formed in peripheral parts of these areas are electrically connected to the integrated circuits formed in the corresponding areas. Further, the thickness of the silicon substrate 2a in the wafer state is somewhat larger than the thickness of the silicon substrate 2a shown in FIG. 2.

Figure 4:
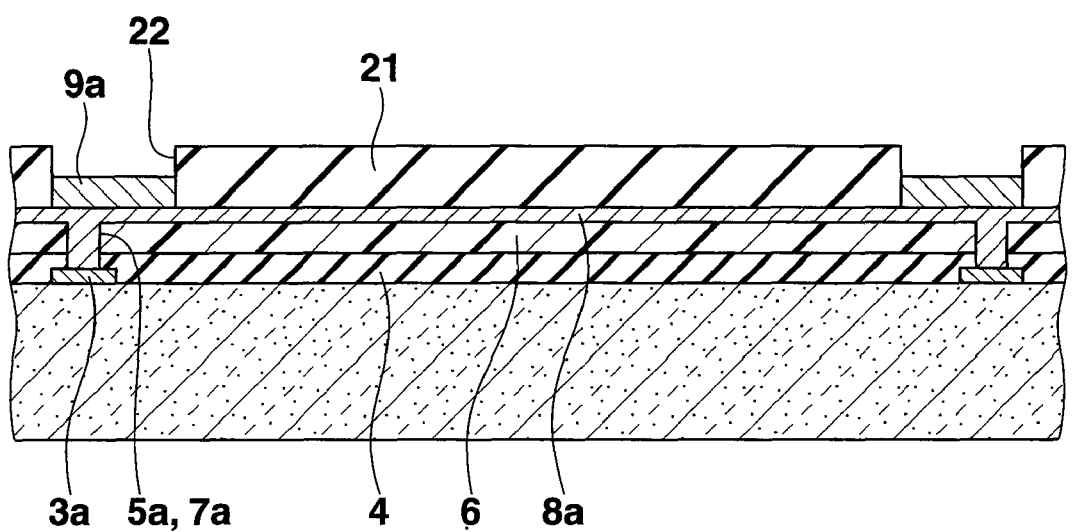
FIG. 4 is a sectional view of a step following FIG. 3.

Next, as shown in FIG. 4, the foundation metal layer 8a (strictly speaking, this is a layer for forming a foundation metal layer 8a, but is referred to as the foundation metal layer in the present invention to make the explanation easier to understand) is formed on the upper surface of the first connection pads 3a exposed via the holes 5a and 7a of the insulating film 4a and all over the upper surface of the protective film 6a. In this case, the foundation metal layer 8a may only be a copper layer formed by electroless plating, may only be a copper layer formed by sputtering, or may be a multilayer formed by sputtering, a copper layer on a thin film layer such as titanium formed by sputtering, for example. It will be appreciated that the materials to form these layers and various conductive layers, metal layers and wiring lines described below are not limited to copper, and may be conductive materials other than copper.

Next, a plating resist film 21 is patterned/formed formed on the upper surface of the foundation metal layer 8a (a film is formed, and then patterned into a predetermined shape). In this case, an opening 22 is formed in the plating resist film 21 in a part corresponding to an area where the first wiring line 9a is formed. Then, electrolytic plating with copper is carried out using the foundation metal layer 8a as a plating current path, thereby forming the first wiring line 9a on the upper surface of the foundation metal layer 8a in the opening 22 of the plating resist film 21. Then, the plating resist film 21 is removed.

Figure 5:
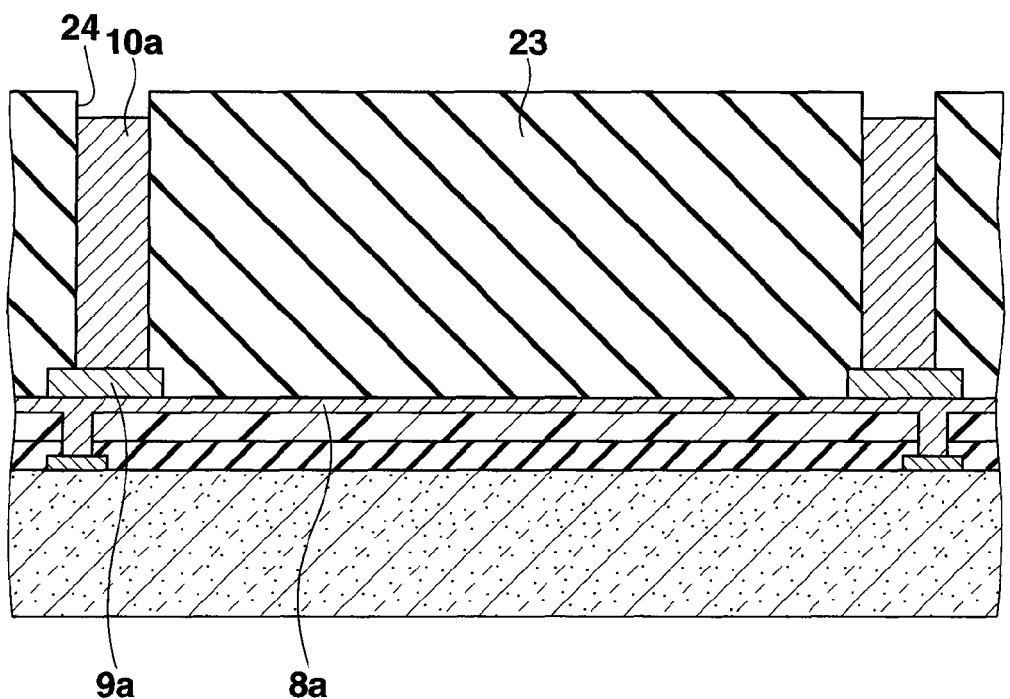
FIG. 5 is a sectional view of a step following FIG. 4.

Next, as shown in FIG. 5, a plating resist film 23 is patterned/formed on the upper surfaces of the first wiring line 9a and the foundation metal layer 8a. In this case, an opening 24 is formed in the plating resist film 23 in a part corresponding to an area where the first columnar electrode 10a is formed. Then, electrolytic plating with copper is carried out using the foundation metal layer 9a as a plating current path, thereby forming the first columnar electrode 10a on the upper surface of the electrical connection portion of the first wiring line 9a in the opening 24 of the plating resist film 23.

Figure 6:
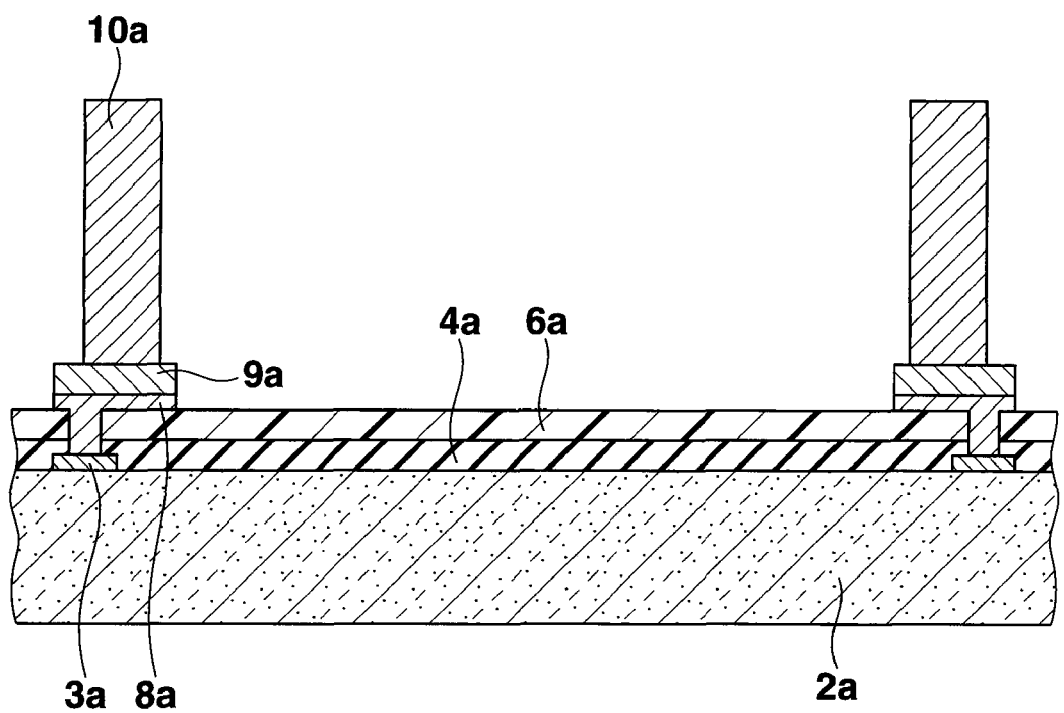
FIG. 6 is a sectional view of a step following FIG. 5.

Subsequently, the plating resist film 23 is removed, and then unnecessary portions of the foundation metal layer 8a are removed by a selectively etching process using the first wiring line 9a as a mask, whereby the foundation metal layer 8a remains under the first wiring line 9a alone, as shown in FIG. 6. In this state, in the area on the silicon substrate 2a in the wafer state where each of the first semiconductor constructs 1a is formed, there are formed the first connection pads 3a, the insulating film 4a, the protective film 6a, the foundation metal layer 8a, the first wiring lines 9a and the first columnar electrodes 10a that constitute the first semiconductor construct 1a.

There are prepared a plurality of materials in which the adhesive bonding layers 12 are provided on the lower surfaces of the silicon substrates 2b of the second semiconductor constructs 1b. In this case, the second semiconductor constructs 1b having the adhesive bonding layers 12 can be obtained as follows: the integrated circuits (not shown) having the predetermined function, the second connection pads 3b, the insulating film 4b, the protective film 6b, the foundation metal layers 8b, the second wiring lines 9b, the second columnar electrodes 10b and the second sealing film 11b are formed on the silicon substrate 2b in the wafer state; and the adhesive bonding layer 12 made of a die bond material such as an epoxy-based resin commercially available as a die attachment film is then fixedly attached in a semi-hardened state by heating and pressurization to the lower surface of the silicon substrate 2b in the wafer state; and finally this assembly is divided into pieces by dicing.

Figure 7:
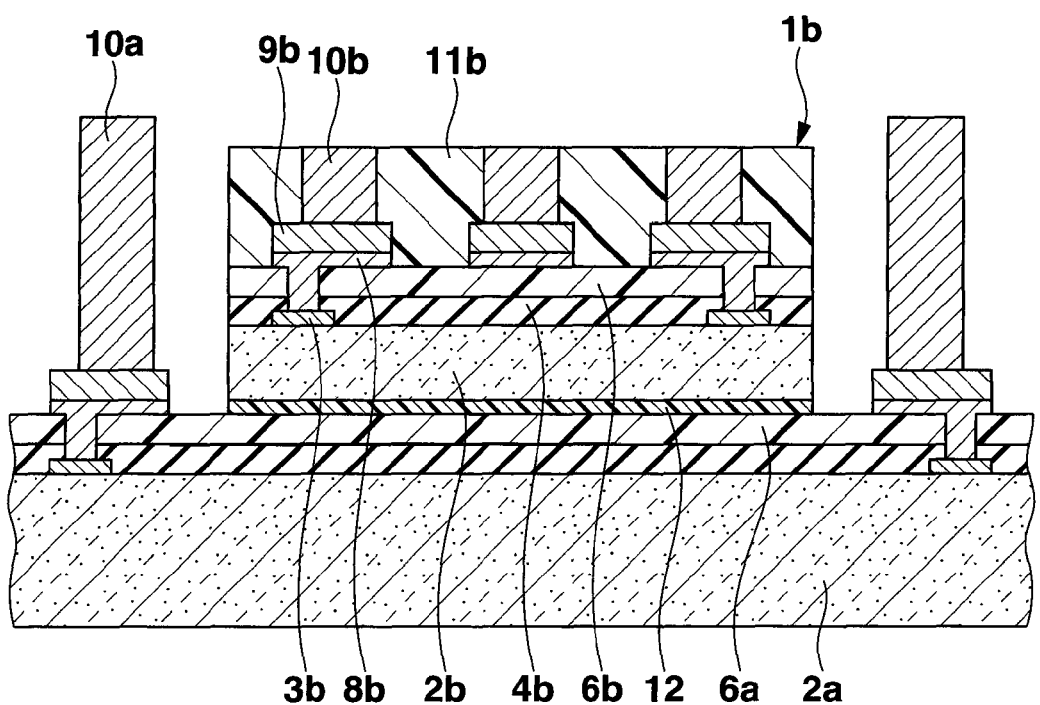
FIG. 7 is a sectional view of a step following FIG. 6.

Next, as shown in FIG. 7, the adhesive bonding layers 12 fixedly attached to the lower surfaces of the silicon substrates 2b of a plurality of semiconductor constructs 1b are adhesively bonded to the centers of the areas on the upper surface of the protective film 6a on the silicon substrate 2a in the wafer state where the first semiconductor constructs 1a are formed. The adhesive bonding here is achieved by the full hardening of the adhesive bonding layers 12 through heating and pressurization. Here, the height of the first columnar electrode 10a of the first semiconductor construct 1a is set to be about 0.01 to 0.07 mm higher than the upper surface of the second sealing film 11b of the second semiconductor construct 1b. By way of example, if the thickness of the second semiconductor construct 1b is 0.12 mm, the height of the first columnar electrode 10a of the first semiconductor construct 1a (strictly speaking, a height including the foundation metal layer 8a and the wiring line 9a) is 0.15 mm.

Figure 8:
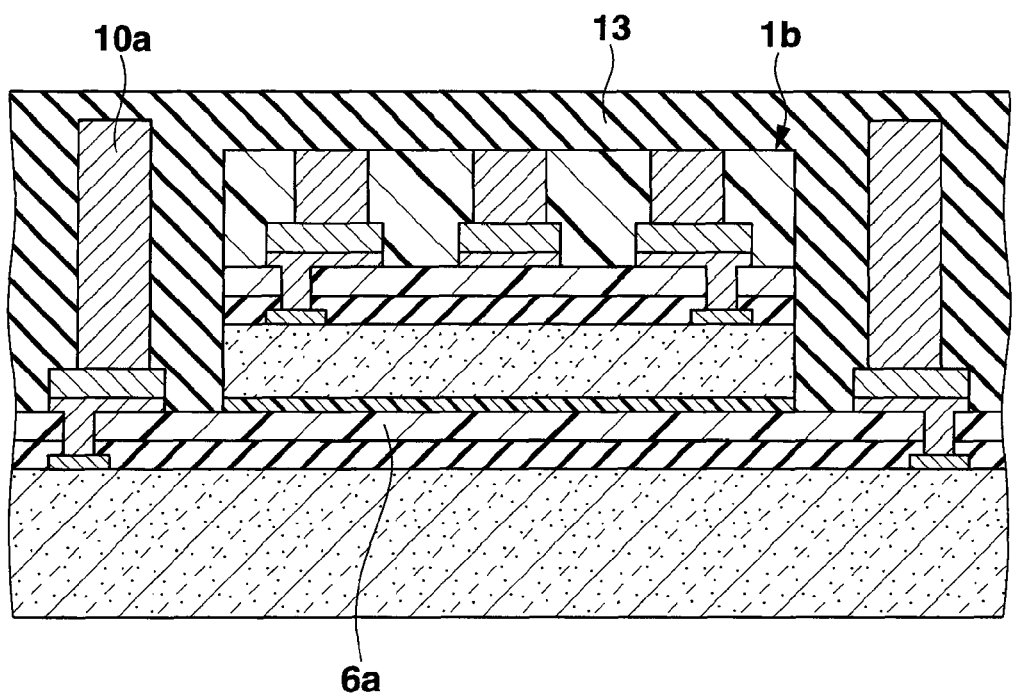
FIG. 8 is a sectional view of a step following FIG. 7.

Next, as shown in FIG. 8, by a method such as a screen printing method, a spin coat method or a die coat method, the insulating film or layer 13 made of, for example, an epoxy-based resin is formed on the upper surfaces of the first columnar electrodes 10a, the protective film 6a and the second semiconductor construct 1b so that the thickness of this insulating film 13 is larger than the height of the first columnar electrode 10a. Thus, in this state, the upper surface of the first columnar electrodes 10a and the upper surface of the second semiconductor construct 1b are covered by the top of the insulating film 13.

Figure 9:
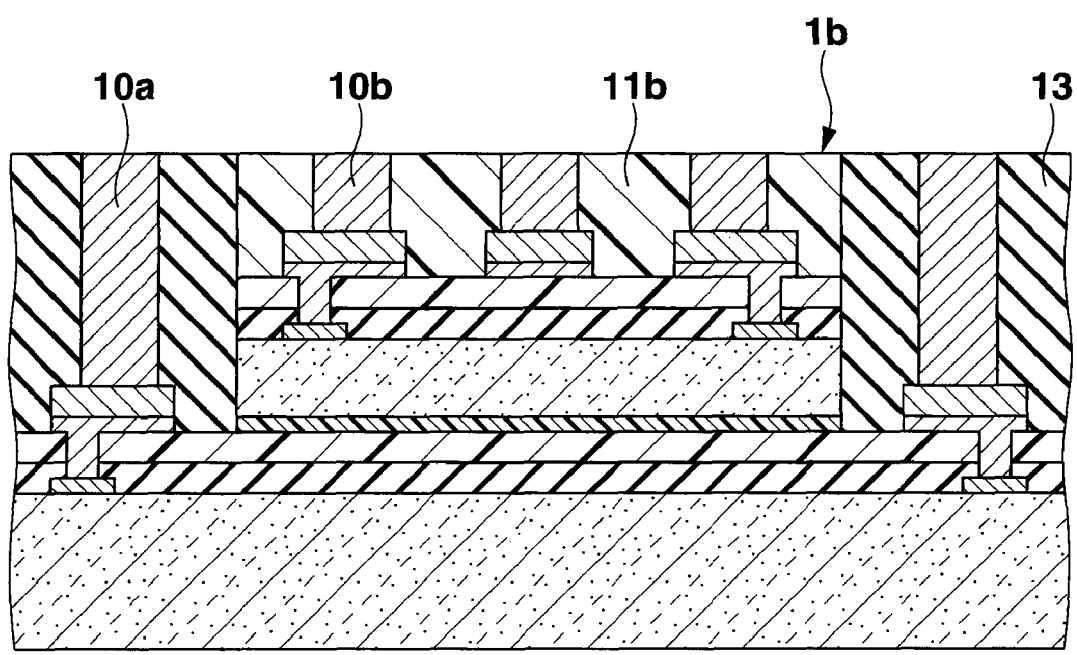
FIG. 9 is a sectional view of a step following FIG. 8.

Next, the upper surface sides of the insulating film 13 and the first columnar electrodes 10a are properly polished, so that, as shown in FIG. 9, the upper surfaces of the second columnar electrodes 10b of the second semiconductor construct 1b, the upper surface of the second sealing film 11b and the upper surfaces of the first columnar electrodes 10a are exposed, and the upper surface of the insulating film 13, the exposed upper surfaces of the first and second columnar electrodes 10a and 10b, and the exposed second sealing film 11b are flattened in the same plane.

Figure 10:
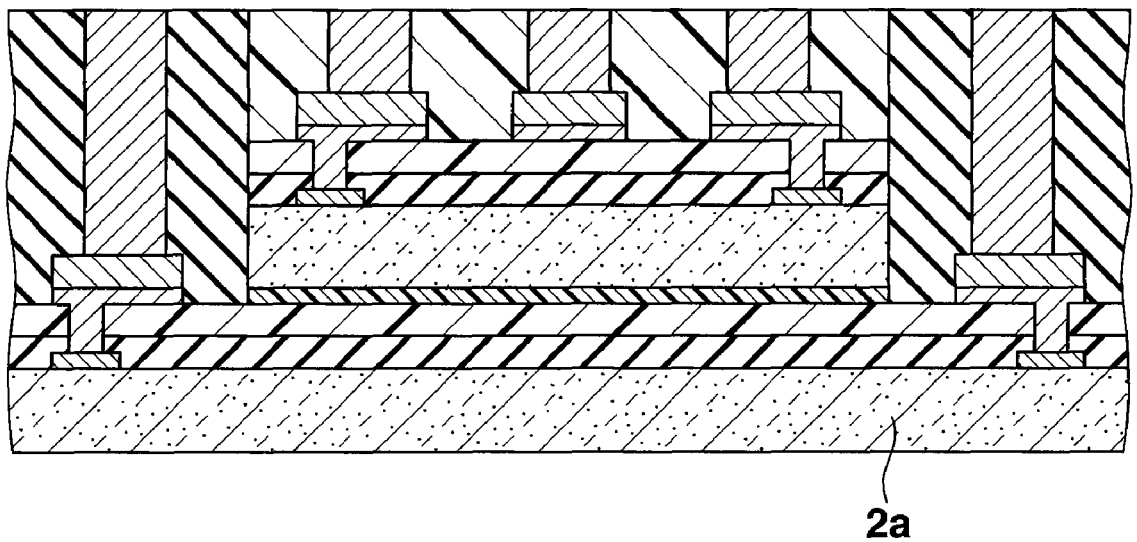
FIG. 10 is a sectional view of a step following FIG. 9.
Figure 11:
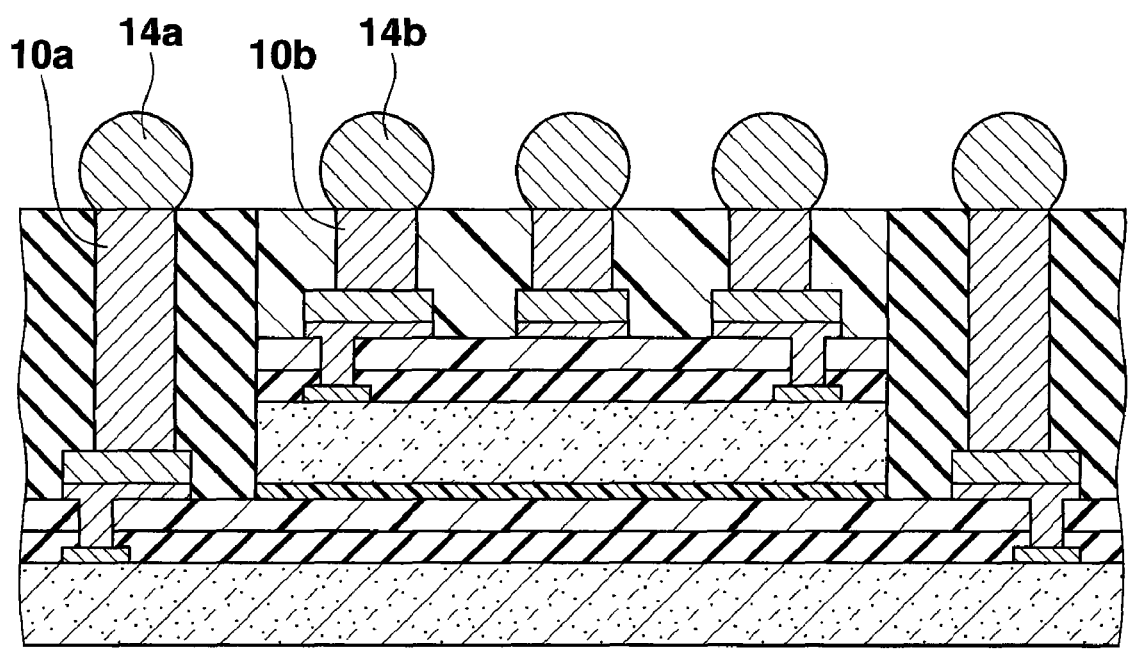
FIG. 11 is a sectional view of a step following FIG. 10.

Next, as shown in FIG. 10, the lower surface side of the silicon substrate 2a in the wafer state is properly polished to reduce the thickness of the silicon substrate 2a in the wafer state. Then, as shown in FIG. 11, the solder balls 14a and 14b are formed or bonded on the upper surfaces of the first and second columnar electrodes 10a and 10b. Subsequently, the second semiconductor constructs 1b are separated from each other by a dicing step, thereby obtaining a plurality of semiconductor devices shown in FIG. 2.

Second Embodiment

Figure 12:
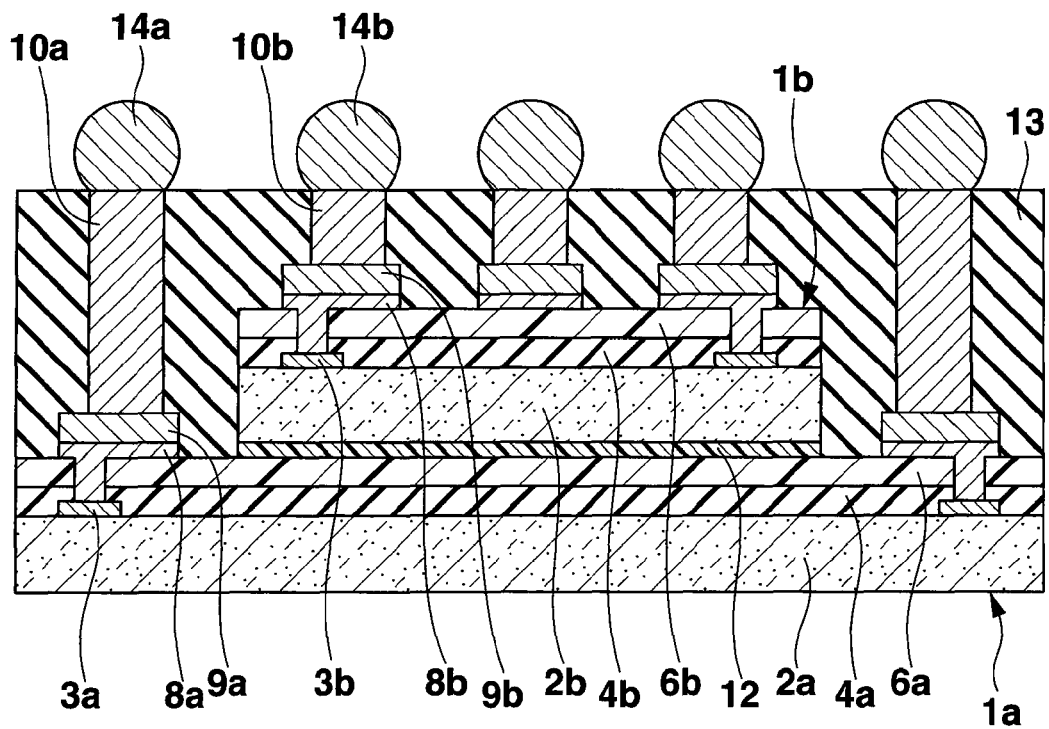
FIG. 12 is a sectional view of a semiconductor device as a second embodiment of this invention.

FIG. 12 is a sectional view of a semiconductor device as a second embodiment of this invention. This semiconductor device is different from the semiconductor device shown in FIG. 2 in that a semiconductor construct having no second sealing film 11b is used in a second semiconductor construct 1b, and in that an insulating film 13 is directly provided on the upper surface of a protective film 6b including a second wiring line 9b so that the upper surface of this insulating film 13 is flush with the upper surfaces of second columnar or bump electrodes 10b.

Figure 13:
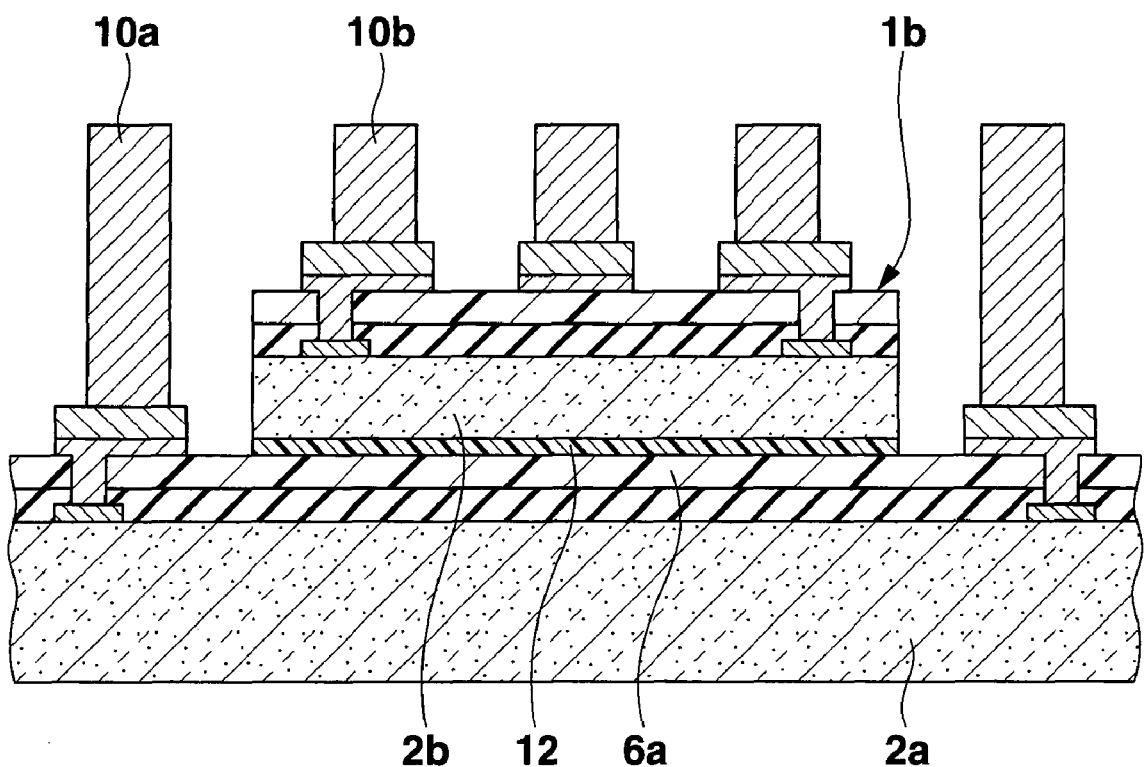
FIG. 13 is a sectional view of a predetermined step in one example of a method of manufacturing the semiconductor device shown in FIG. 12.

Next, one example of a method of manufacturing this semiconductor device will be described. First, after the step shown in FIG. 6, adhesive bonding layers 12 fixedly attached to the lower surfaces of silicon substrates 2b of a plurality of semiconductor constructs 1b are adhesively bonded to the centers of the areas on the upper surface of a protective film 6a on a silicon substrate 2a in a wafer state where first semiconductor constructs 1a are formed, shown in FIG. 13. In this case, the semiconductor constructs 1b have no second sealing film 11b shown in FIG. 7. Moreover, the height of the second columnar electrode 10b of the second semiconductor construct 1b is somewhat larger than that in the case shown in FIG. 7, and is about the same as the height of a first columnar or bump electrode 10a of each of the first semiconductor constructs 1a.

Figure 14:
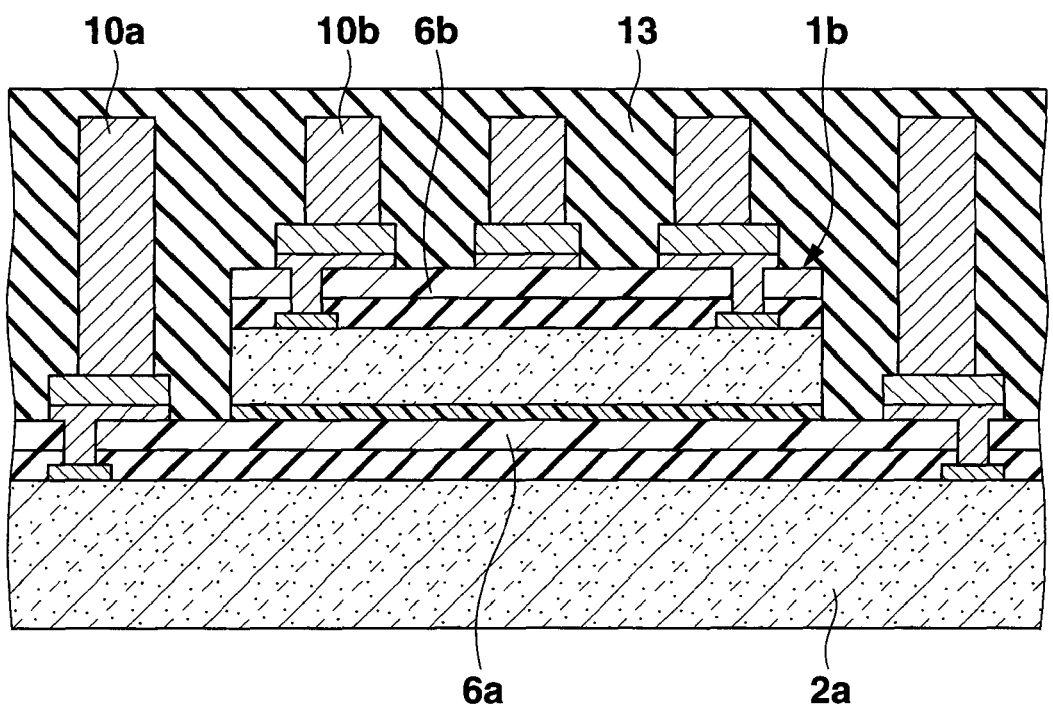
FIG. 14 is a sectional view of a step following FIG. 13.

Next, as shown in FIG. 14, by a method such as a screen printing method, a spin coat method or a die coat method, the insulating film or layer 13 made of, for example, an epoxy-based resin is formed on the upper surfaces of the protective film 6a, and the first columnar electrodes 10a, and the protective film 6b, and the second columnar electrodes 10b of the second semiconductor construct 1b so that the thickness of this insulating film 13 is larger than the height of the first and second columnar electrodes 10a and 10b. Thus, in this state, the upper surfaces of the first and second columnar electrodes 10a and 10b are covered by the upper part of the insulating film 13. Subsequently, as in the first embodiment, the upper surface sides of the insulating film 13, etc. are polished, an then the lower surface side of the silicon substrate 2a is polished, solder balls 14a and 14b are formed, and dicing is carried out, thereby obtaining a plurality of semiconductor devices shown in FIG. 12.

Third Embodiment

Figure 15:
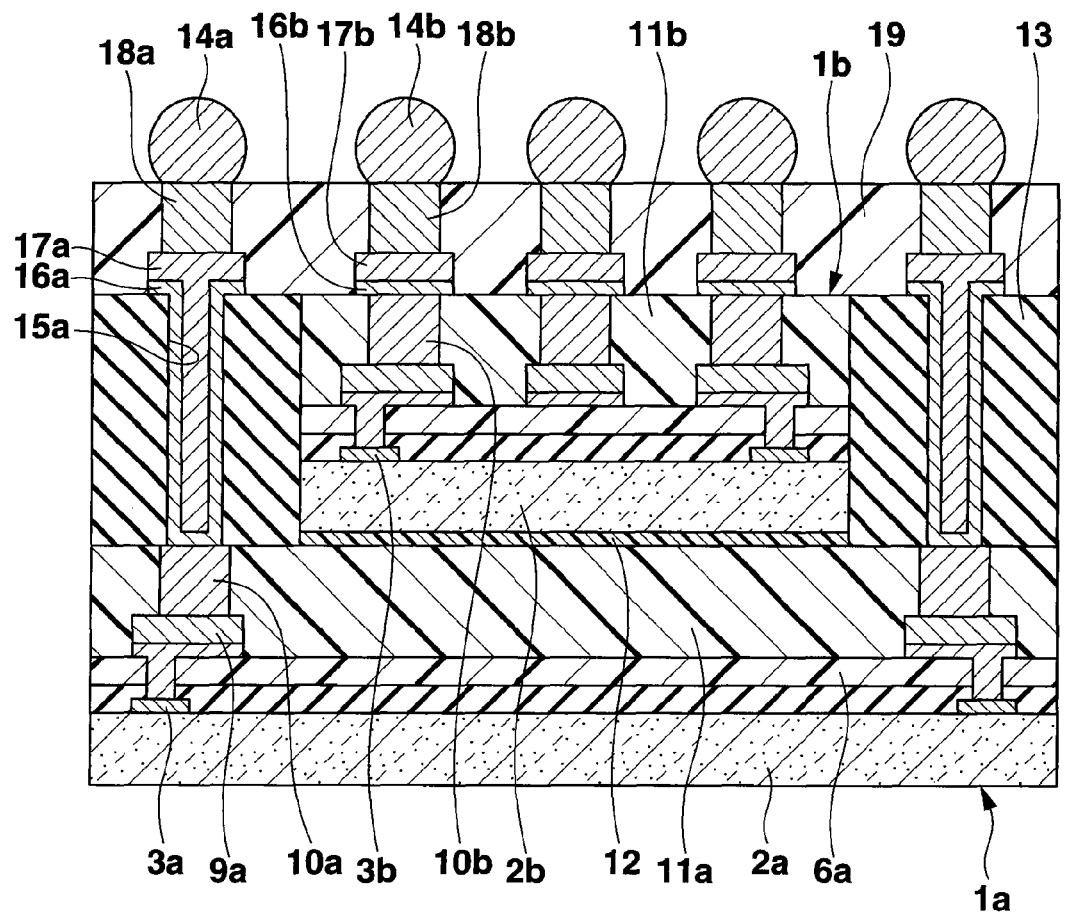
FIG. 15 is a sectional view of a semiconductor device as a third embodiment of this invention.

FIG. 15 is a sectional view of a semiconductor device as a third embodiment of this invention. The great differences between this semiconductor device and the semiconductor device shown in FIG. 2 are that a semiconductor construct having a first sealing film 11a is used as a first semiconductor construct 1a, and that first and second upper layer wiring lines 17a and 17b, upper layer columnar or bump electrodes (third columnar electrodes) 18a and 18b, an overcoat film 19, solder balls 14a and 14b, etc. are provided on a second semiconductor construct 1b and an insulating film 13.

That is, the first semiconductor construct 1a has a structure in which the first sealing film 11a is provided on the upper surfaces of a protective film 6a and first wiring lines 9a so that the upper surface of the first sealing film 11a is flush with the upper surfaces of first columnar electrodes 10a. In this case, the height of the first columnar electrode 10a is somewhat smaller than the height of the first columnar electrode 10a shown in FIG. 2.

The lower surface of a silicon substrates 2b of the second semiconductor construct 1b is adhesively bonded via an adhesive bonding layer 12 to the center of the upper surface of the first sealing film 11a. The insulating film or layer 13 is provided on the upper surfaces of the first sealing film 11a and the first columnar electrodes 10a of the first semiconductor construct 1a around the second semiconductor construct 1b so that the upper surface of the insulating film 13 is flush with the upper surface of the second sealing film 11b of the second semiconductor construct 1b. In this case, vertical through holes 15a are formed in the insulating film 13 in parts corresponding to the centers of the upper surfaces of the first columnar electrodes 10a of the first semiconductor construct 1a.

Upper layer foundation metal layers 16a and 16b made of, for example, copper are respectively provided on the upper surfaces of the insulating film 13 and the second sealing film 11b. The first and second upper layer wiring lines 17a and 17b made of copper are provided all over the upper surfaces of the upper layer foundation metal layers 16a and 16b. One end of the first upper layer wiring line 17a is connected to the upper surface of the first columnar electrode 10a of the first semiconductor construct 1a via the hole 15a formed through the insulating film 13, so that the upper layer foundation metal layer 16a is electrically connected to the first columnar electrode 10a. One end of the upper layer foundation metal layer 16b is connected to the upper surface of the second columnar electrode 10b of the second semiconductor construct 1b, so that the second upper layer wiring line 17b is electrically connected to the electrode 10b.

The upper layer columnar or bump electrodes 18a and 18b made of copper are respectively provided on the upper surfaces of the first and second upper layer wiring lines 17a and 17b, and parts of the upper surfaces of the first and second upper layer wiring lines 17a and 17b connected to the upper layer columnar electrodes 18a and 18b are called electrical connection parts. The overcoat film 19 made of, for example, an epoxy-based resin is provided on the upper surfaces of the second sealing film 11b, the insulating film 13, the first and second upper layer wiring lines 17a and 17b so that the upper surface of this overcoat film 19 is flush with the upper surfaces of the upper layer columnar electrodes 18a and 18b in the same plane. The solder balls 14a and 14b are respectively provided on the upper surfaces of the upper layer columnar electrodes 18a and 18b.

Next, in connection with this semiconductor device, a case will be described where the through hole 15a is formed in the insulating film 13. For example, as shown in FIG. 9, the upper surface of the second sealing film 11b including the upper surface of the second columnar electrode 10b of the second semiconductor construct 1b is exposed by polishing, and the upper surface of the insulating film 13 including the exposed upper surfaces of the first columnar electrode 10a and the second sealing film 11b is flattened in the same plane, and then the hole 15a is formed in the insulating film 13 in part corresponding to the center of the upper surface of the first columnar electrode 10a of the first semiconductor construct 1a by laser processing in which a laser beam is applied or by a photolithographic method.

Fourth Embodiment

Figure 16:
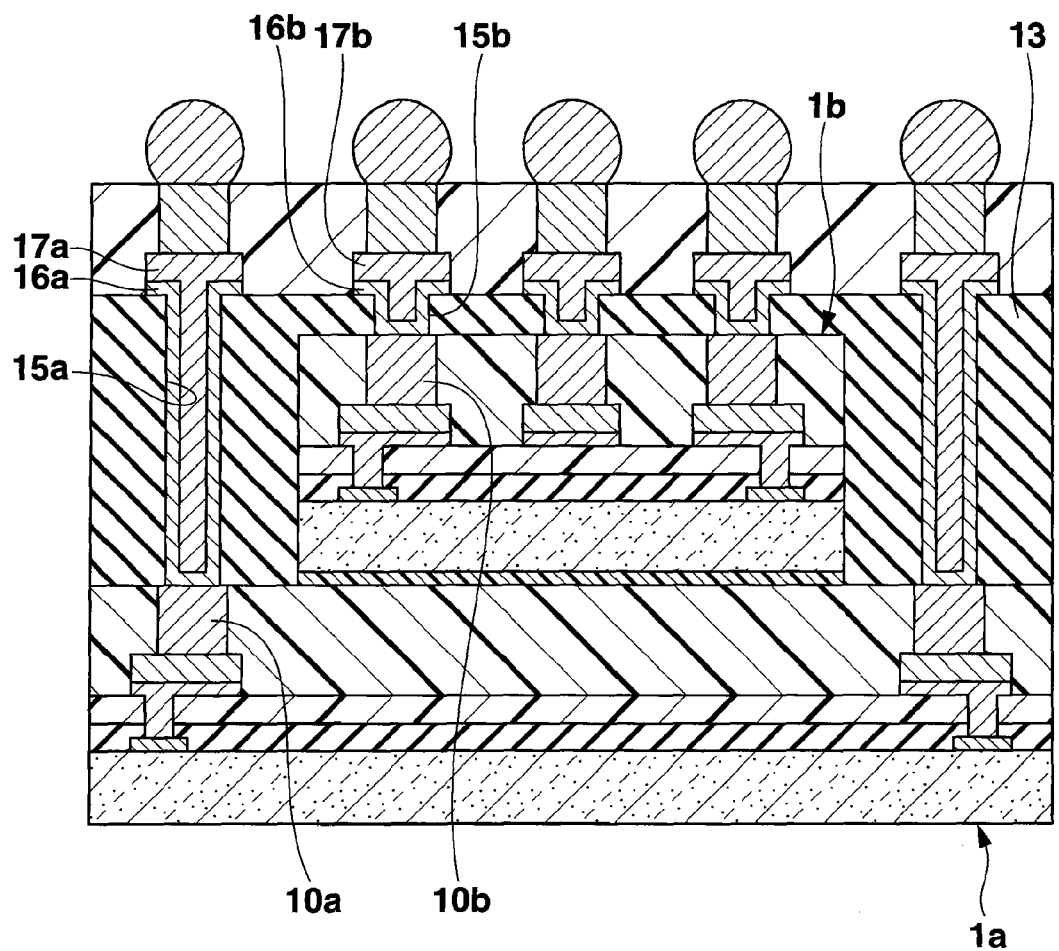
FIG. 16 is a sectional view of a semiconductor device as a fourth embodiment of this invention.

FIG. 16 shows a sectional view of a semiconductor device as a fourth embodiment of this invention. This semiconductor device is different from the semiconductor device shown in FIG. 15 in that the upper surface of a second semiconductor construct 1b is covered with a part of an insulating film 13, in that a through hole 15b is formed in the insulating film 13 in a part corresponding to the center of the upper surface of a second columnar electrode 10b of the second semiconductor construct 1b, and in that one end of an upper layer foundation metal layer 16b is connected to the upper surface of the second columnar electrode 10b of the second semiconductor construct 1b via the hole 15b formed through the insulating film 13, so that a second upper layer wiring line 17b is electrically connected to the second columnar electrode 10b.

Next, in connection with this semiconductor device, a case will be described where the holes 15a and 15b are formed in the insulating film 13. For example, as shown in FIG. 8, the insulating film 13 is formed to cover the upper surface of the second semiconductor construct 1b, and then the holes 15a and 15b are formed in the insulating film 13 in parts corresponding to the centers of the upper surfaces of the first and second columnar electrodes 10a and 10b of the first and second semiconductor constructs 1a and 1b by laser processing in which a laser beam is applied or by a photolithographic method.

Fifth Embodiment

Figure 17:
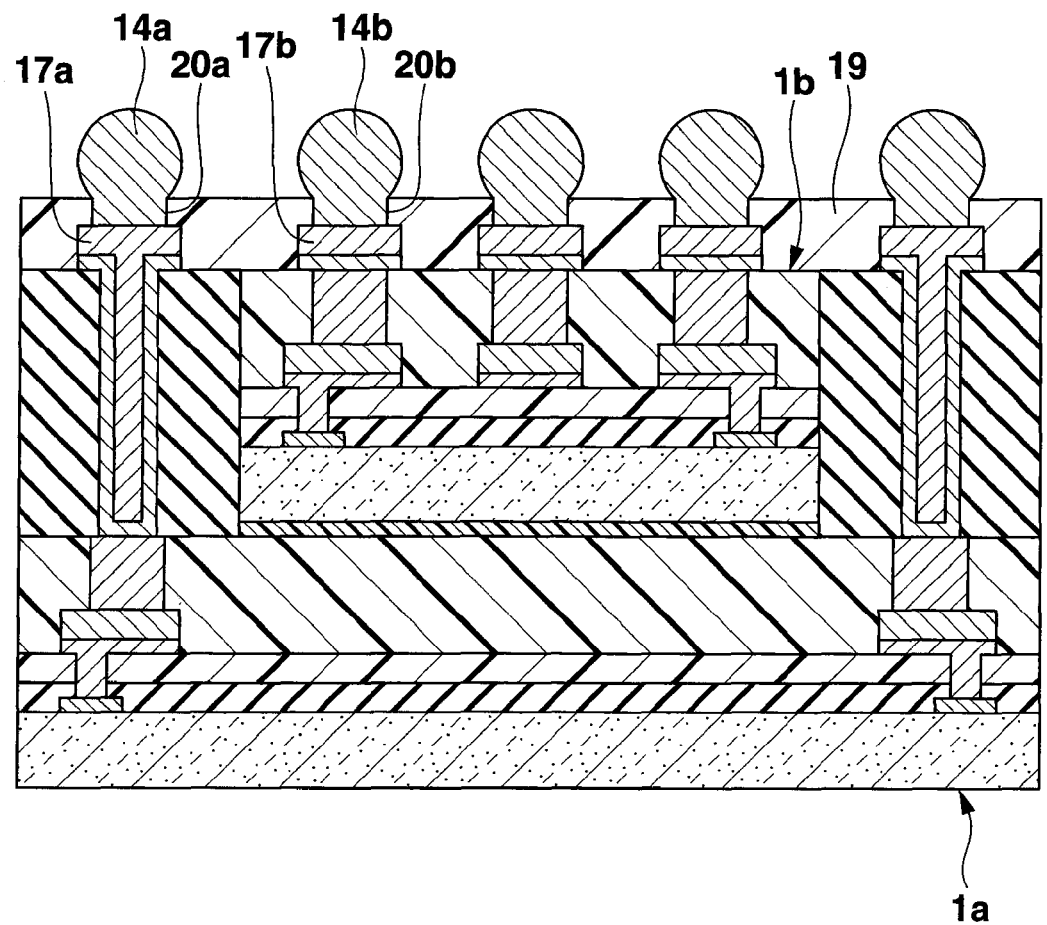
FIG. 17 is a sectional view of a semiconductor device as a fifth embodiment of this invention.

FIG. 17 shows a sectional view of a semiconductor device as a fifth embodiment of this invention. This semiconductor device is different from the semiconductor device shown in FIG. 15 in that this semiconductor device does not have upper layer columnar electrodes 18a and 18b, in that an overcoat film 19 is formed by, for example, a solder resist, in that vertical through holes 20a and 20b are formed in the overcoat film 19 in parts corresponding to the electrical connection parts of first and second upper layer wiring lines 17a and 17b, and in that solder balls 14a and 14b are provided in and above the holes 20a and 20b so that these solder balls 14a and 14b are connected to the electrical connection parts of the first and second upper layer wiring lines 17a and 17b.

Sixth Embodiment

Figure 18:
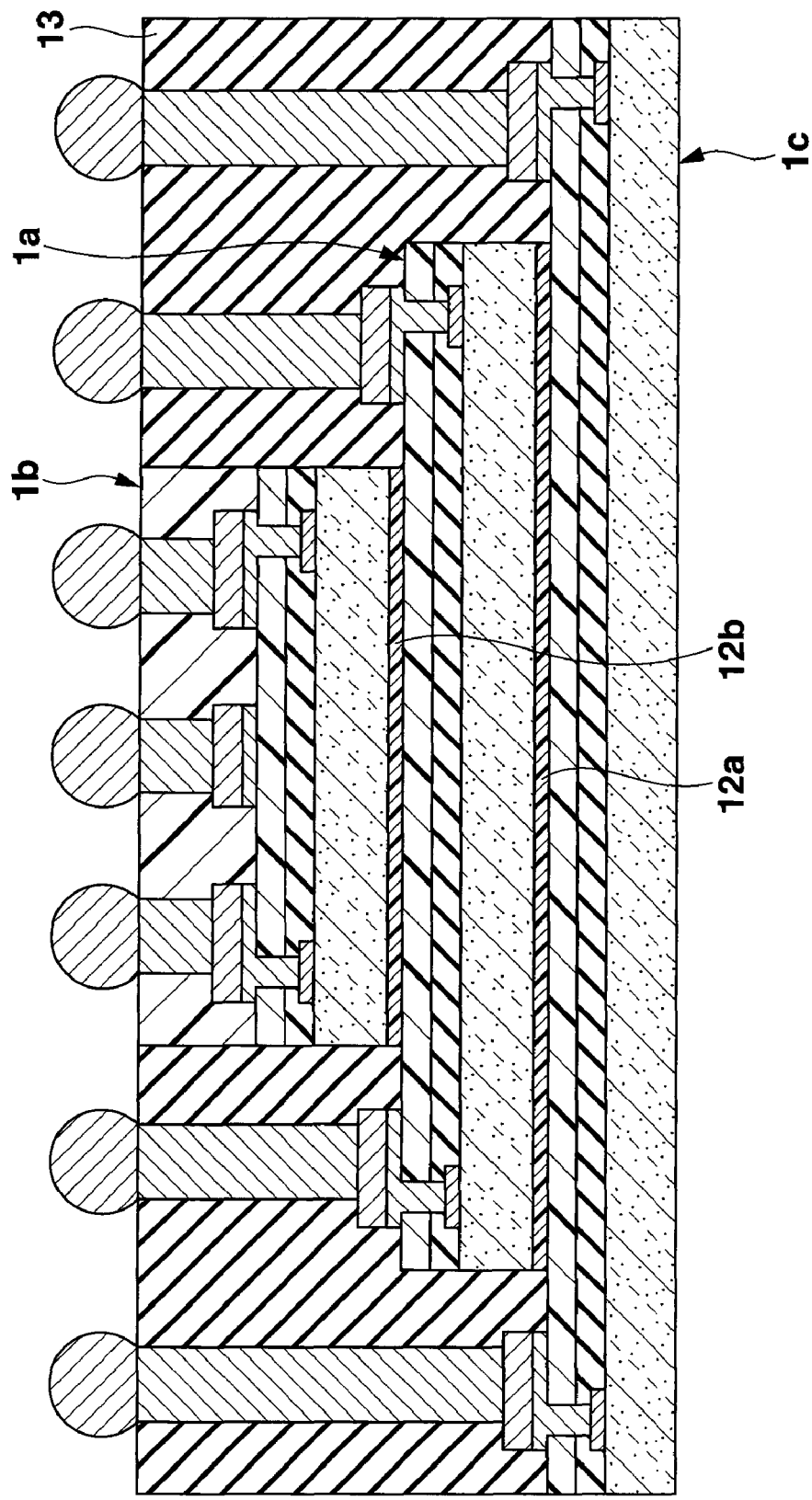
FIG. 18 is a sectional view of a semiconductor device as a six embodiment of this invention.

While the cases have been described in the above embodiments where two semiconductor constructs are stacked, three or more semiconductor constructs may be stacked, and, for example, three semiconductor constructs may be stacked as in a sixth embodiment of this invention shown in FIG. 18. The great differences between this semiconductor device and the semiconductor device shown in FIG. 2 are that a first semiconductor construct 1a is stacked via an adhesive bonding layer 12a in the center on an undermost layer semiconductor construct 1c having a planar-size (dimensions along a planar surface) larger than that of the first semiconductor construct 1a and having a structure similar to that of the first semiconductor construct 1a, that a second semiconductor construct 1b is stacked in the center on the first semiconductor construct 1a via an adhesive bonding layer 12b, and that an insulating film 13 is provided on the undermost layer semiconductor construct 1c and the first semiconductor construct 1a around the second semiconductor construct 1b.

While the first columnar electrodes 10a of the first semiconductor construct 1a are arranged in only one column or row around the second semiconductor construct 1b in the configurations shown in the embodiments described above, the first columnar electrodes 10a may be arranged in a plurality of columns or rows around the second semiconductor construct 1b. Moreover, while the first columnar electrode 10a of the first semiconductor construct 1a is connected to the first connection pad 3a via the foundation metal layer 8a and the first wiring line 9a formed on the first connection pad 3a and the protective film 6a in the shown configurations, each of the first columnar electrodes 10a may be formed on the first connection pad 3a directly or with a foundation metal layer for adhesive bonding and/or for a barrier interposed therebetween.

In the present invention, a number of semiconductor constructs, each including a semiconductor substrate is not limited, and may be two or more, wherein semiconductor constructs being stacked from bottom to top in descending order of planar-sizes of the semiconductor substrates included in the plurality of semiconductor constructs.

What is claimed is:

1. A method for manufacturing a plurality of semiconductor devices, the method comprising:
    preparing a first semiconductor construct including a first semiconductor substrate and a plurality of first external connection electrodes provided in each of a plurality of areas of an upper surface of the first semiconductor substrate;
    preparing a plurality of second semiconductor constructs, each of which includes a second semiconductor substrate, a plurality of second external connection electrodes provided on an upper surface of the second semiconductor substrate, and a sealing film covering the second semiconductor substrate and peripheral surfaces of the second external connection electrodes;
    fixing each of the second semiconductor constructs on a central part of one of the areas of the first semiconductor construct by an adhesive bonding layer provided therebetween;
    forming an insulating film on a side of an upper surface of the first semiconductor construct and upper surfaces of the plurality of second semiconductor constructs to cover the first and second external connection electrodes; and
    removing an upper part of the insulating film to expose upper surfaces of the first and second external connection electrodes, and upper surfaces of the sealing films.

2. The manufacturing method according to claim 1, wherein the forming of the insulating film is carried out by one of a screen printing method, a spin coat method, and a die coat method.

3. The manufacturing method according to claim 1, wherein the removing of the upper part of the insulating film comprises polishing the upper part of the insulating film to expose the upper surfaces of the second external connection electrodes and the upper surfaces of the sealing films.

4. The manufacturing method according to claim 3, wherein the removing of the upper part of the insulating film comprises polishing the exposed upper surfaces of the first external connection electrodes.

5. The manufacturing method according to claim 4, wherein preparing the first semiconductor construct includes forming columnar electrodes electrically connected to connection pads of the first semiconductor construct, as parts of the first external connection electrodes.

6. The manufacturing method according to claim 5, further comprising forming solder balls on the exposed upper surfaces of the first and second external connection electrodes, respectively.

7. The manufacturing method according to claim 3, wherein the first semiconductor construct further includes another sealing film for covering the first external connection electrodes.

8. The manufacturing method according to claim 7, further comprising forming openings in parts of the insulating film which correspond to central parts of the upper surfaces of the first external connection electrodes by laser processing or a photolithographic method, after the polishing.

9. The manufacturing method according to claim 8, further comprising forming first and second upper wiring lines after forming the openings, one end portion of each of the first upper wiring lines being electrically connected to the upper surface of one of the first external connection electrodes through one of the openings, and one end of each of the second upper wiring lines being electrically connected to the upper surface of one of the second external connection electrodes.

10. The manufacturing method according to claim 9, further comprising forming third external connection electrodes on connection pads of the first and second upper wiring lines, respectively, after forming the first and second upper wiring lines.

11. The manufacturing method according to claim 10, further comprising forming solder balls on upper surfaces of the third external connection electrodes, after forming the third external connection electrodes.

12. The manufacturing method according to claim 10, wherein forming the third external connection electrodes comprises forming columnar electrodes as the third external connection electrodes.

13. The manufacturing method according to claim 9, further comprising forming solder balls on upper surfaces of the first and second upper wiring lines, respectively, after forming the first and second upper wiring lines.

14. The manufacturing method according to claim 1, wherein the first semiconductor construct further includes another sealing film for covering the first external connection electrodes.

15. The manufacturing method according to claim 14, further comprising forming openings in parts of the insulating film which correspond to central parts of the upper surfaces of the first and second external connection electrodes by laser processing or a photolithographic method, after forming the insulating film.

16. The manufacturing method according to claim 15, further comprising forming first and second upper wiring lines after forming the openings, one end portion of each of the first upper wiring lines being electrically connected to the upper surface of one of the first external connection electrodes through one of the openings, and one end of each of the second upper wiring lines being electrically connected to the upper surface of one of the second external connection electrodes through one of the openings.

17. The manufacturing method according to claim 16, further comprising forming third external connection electrodes on connection pads of the first and second upper wiring lines, respectively, after forming the first and second upper wiring lines.

18. The manufacturing method according to claim 17, further comprising forming solder balls on upper surfaces of the third external connection electrodes, respectively, after forming the third external connection electrodes.

19. The manufacturing method according to claim 17, wherein forming the third external connection electrodes comprises forming columnar electrodes as the third external connection electrodes.

20. The manufacturing method according to claim 7, wherein the first semiconductor construct includes columnar electrodes electrically connected to connection pads of the first semiconductor construct, as the first external connection electrodes.

21. The manufacturing method according to claim 14, wherein the first semiconductor construct includes columnar electrodes electrically connected to connection pads of the first semiconductor construct, as the first external connection electrodes.

22. The manufacturing method according to claim 1, further comprising polishing an under surface of the first semiconductor construct.

23. The manufacturing method according to claim 1, further comprising dicing the first semiconductor construct to obtain the plurality of semiconductor devices, each of which contains a part of the first semiconductor construct and the second semiconductor construct bonded to the part of the first semiconductor construct.

24. The manufacturing method according to claim 1, wherein the second semiconductor construct includes a plurality of columnar electrodes electrically connected to connection pads of the second semiconductor construct, as the second external connection electrodes.

25. The manufacturing method according to claim 3, wherein the polishing includes polishing the upper surfaces of the second external connection electrodes and the upper surfaces of the sealing films.

26. The manufacturing method according to claim 25, wherein the polishing includes polishing the upper surfaces of the first external connection electrodes.

27. A method for manufacturing a plurality of semiconductor devices, the method comprising:
   preparing a first semiconductor construct including a first semiconductor substrate and a plurality of first external connection electrodes provided in each of a plurality of areas of an upper surface of the first semiconductor substrate;
   preparing a plurality of second semiconductor constructs, each of which includes a second semiconductor substrate, a plurality of second external connection electrodes provided on an upper surface of the second semiconductor substrate, and a sealing film covering the second semiconductor substrate and peripheral surfaces of the second external connection electrodes;
   fixing each of the second semiconductor constructs on a central part of one of the areas of the first semiconductor construct by an adhesive bonding layer provided therebetween;
   forming an insulating film on a side of an upper surface of the first semiconductor construct and upper surfaces of the plurality of second semiconductor constructs to cover the first and second external connection electrodes; and
   removing an upper part of the insulating film to expose upper surfaces of the first and second external connection electrodes, and upper surfaces of the sealing films;
   wherein the upper surfaces of the first and second external connection electrodes and the upper surfaces of the sealing films are positioned on a same plane.

28. The manufacturing method according to claim 27, wherein the removing of the upper part of the insulating film comprises polishing the upper part of the insulating film to expose the upper surfaces of the first and second external connection electrodes, and the upper surfaces of the sealing film.

* * * * *